United States Patent
Enenkl (10) Patent No.: US 9,980,043 B2
(45) Date of Patent: May 22, 2018

(54) METHOD AND DEVICE FOR ADJUSTING BALANCE BETWEEN FREQUENCY COMPONENTS OF AN AUDIO SIGNAL

(71) Applicant: Sony Corporation, Tokyo (JP)

(72) Inventor: Michael Enenkl, Stuttgart (DE)

(73) Assignee: SONY CORPORATION, Tokyo (JP)

(*) Notice: Subject to any disclaimer, the term of this patent is extended or adjusted under 35 U.S.C. 154(b) by 51 days.

(21) Appl. No.: 15/075,315

(22) Filed: Mar. 21, 2016

(65) Prior Publication Data

US 2016/0295325 A1    Oct. 6, 2016

(30) Foreign Application Priority Data

Mar. 31, 2015 (EP) .................................. 15162067

(51) Int. Cl.
| | | |
|---|---|---|
| H04B 15/00 | (2006.01) | |
| H04R 3/04 | (2006.01) | |
| H03G 5/16 | (2006.01) | |
| H03G 3/32 | (2006.01) | |
| H04R 3/00 | (2006.01) | |

(52) U.S. Cl.
CPC ............... *H04R 3/04* (2013.01); *H03G 3/32* (2013.01); *H03G 5/165* (2013.01); *H04R 3/007* (2013.01); *H04R 2410/05* (2013.01)

(58) Field of Classification Search
CPC .................................................... H04B 15/00
See application file for complete search history.

(56) References Cited

U.S. PATENT DOCUMENTS

| 7,209,567 | B1 | 4/2007 | Kozel et al. | |
|---|---|---|---|---|
| 2007/0009109 | A1* | 1/2007 | Ise | H04B 17/345 |
| | | | | 381/94.2 |
| 2009/0323976 | A1* | 12/2009 | Asada | G10K 11/178 |
| | | | | 381/71.1 |
| 2011/0004470 | A1 | 1/2011 | Konchitsky et al. | |
| 2012/0171974 | A1* | 7/2012 | Cimaz | 455/114.2 |
| 2013/0343557 | A1 | 12/2013 | Sontacchi et al. | |
| 2014/0200881 | A1* | 7/2014 | Chatlani | G10L 21/0232 |
| | | | | 704/205 |
| 2015/0200640 | A1* | 7/2015 | Hogan | H03G 3/004 |
| | | | | 381/108 |
| 2015/0271439 | A1* | 9/2015 | Okano | G10L 21/0232 |
| | | | | 381/71.14 |
| 2015/0281830 | A1* | 10/2015 | Gauger, Jr. | H03G 3/32 |
| | | | | 381/71.6 |
| 2015/0281834 | A1* | 10/2015 | Takano | H04R 1/08 |
| | | | | 381/92 |

OTHER PUBLICATIONS

"Blackbox M10-RB Review", http://www.hathifi.com/blackbox/m10-rb/review, 2015, 4 pages.

Christopher MacManus "The Science of Sony's Digital Noise Canceling", Sony Insider, Jun. 16, 2009, 10 pages.

* cited by examiner

*Primary Examiner* — Olisa Anwah
(74) *Attorney, Agent, or Firm* — Oblon, McClelland, Maier & Neustadt, L.L.P.

(57) ABSTRACT

A method comprising determining an audio noise spectrum that represents external audio noise, determining an audio reference spectrum that represents audio content to be perceived by a listener, and determining a compensation spectrum based on the audio noise spectrum and based on the audio reference spectrum.

14 Claims, 6 Drawing Sheets

METHOD AND DEVICE FOR ADJUSTING BALANCE BETWEEN FREQUENCY COMPONENTS OF AN AUDIO SIGNAL

TECHNICAL FIELD

The present disclosure generally pertains to the field of sound equalization, in particular to methods and devices for adjusting the balance between frequency components of an audio signal.

TECHNICAL BACKGROUND

In case of listening to audio content such as music via e.g. headphones, the surrounding noise of the listener is affecting the sonic impression of the material. The external noise may mask the perception of the music material.

When listening with headphones to audio reproduced by a music player the sound may be perfect in a listening environment with no or low external noise. In case of a noisy environment (e.g. a train) the headphone listening experience will, however, be degraded by the auditory masking effect. The low frequencies below the threshold of the external noise will not be heard well. The headphone will actually sound as if it is not supplying any frequencies below a certain low frequency. The result is a perception of a degraded bass.

Active noise control, also known as noise cancellation or active noise reduction, is a method for reducing unwanted sound by the addition of other sound that is introduced to cancel the unwanted sound. Active noise control is typically realised based on analogue circuits or digital signal processing. Adaptive algorithms are designed to analyse the waveform of the background noise. Then, a signal is generated that will either phase shift or invert the polarity of the original signal.

Noise cancellation, however, requires a special loud speaker to be collocated with the sound source to be attenuated. Still further, state of the art active noise cancelling systems degrade the lower frequency perception.

Although, there exist techniques for active noise reduction, it is generally desirable to provide alternative methods and devices for noise control.

SUMMARY

According to a first aspect, the disclosure provides a method comprising determining an audio noise spectrum that represents external audio noise, determining an audio reference spectrum that represents audio content to be perceived by a listener, and determining a compensation spectrum based on the audio noise spectrum and based on the audio reference spectrum.

According to a further aspect, the disclosure provides an electronic device comprising a noise spectrum determination unit arranged to determine an audio noise spectrum that represents external audio noise, a reference spectrum determination unit arranged to determine an audio reference spectrum that represents audio content to be perceived by a listener, and a compensation spectrum determination unit arranged to determine a frequency compensation spectrum based on the audio noise spectrum and based on the audio reference spectrum.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Before a detailed description of the embodiments is given under reference to the drawings, some general explanations are made.

Disclosed here are methods comprising determining an audio noise spectrum that represents external audio noise, determining an audio reference spectrum that represents audio content to be perceived by a listener, and determining a compensation spectrum based on the audio noise spectrum and based on the audio reference spectrum The disclosed method may be used to determine the external noise spectrum at a listener's ear and dynamically adjust the frequency response of an electronic device such as a music player so that the listener will be able to hear all frequencies of the desired music material in an optimized way.

The method may for example be applied in an electronic device such as a music player, in particular in a portable music player, such as a mobile phone or a portable audio player. The disclosure is however not restricted to such a use. The concept disclosed in this specification may for example also be used in connection with automobile radios or in other situations where noise disturbs a listener's experience of audio content.

External audio noise may for example be the noise of a driving train when listening to music in a train compartment. External audio noise might also be the sound of a motor inside a car cabin or the like.

An audio noise spectrum may for example be a frequency spectrum that is obtained from captured external audio noise. An audio noise spectrum may for example be obtained by a Fast Fourier Transformation (FFT) of a captured audio noise signal.

An audio noise spectrum may for example be represented by a set of frequencies and respective phases. An audio noise spectrum may also be represented by a power spectrum. A power spectrum may for example be represented by amplitudes, or squared amplitudes.

The audio noise signal may for example be captured with a microphone. The microphone may be attached to an audio player or it may be a microphone which is internal to the audio player. In specific embodiments, a microphone is attached to an electronic device in order to optimize the capturing of external audio noise.

Audio content to be perceived by a listener may be any type of audio that is produced by an electronic device such as an audio player for hearing by a listener. The listener may for example use a headphone to hear the audio content. The audio content may for example be a piece of music, an audio stream of a radio broadcast or the like.

An audio reference spectrum may be obtained by Fast Fourier Transformation (FFT) and represented by e.g. frequencies, phases, amplitudes, or squared amplitudes. In particular the audio reference spectrum can be represented as a power spectrum comprising amplitudes or squared amplitudes.

The audio reference spectrum and the audio noise spectrum may for example be represented by a Sound Pressure Level (SPL) spectrum of sound acting on the listener's ears. The sound pressure level (SPL) or acoustic pressure level is a logarithmic measure of the effective sound pressure of a sound relative to a reference value. A commonly used reference sound pressure in ear is the threshold of human hearing which is 20 µPa.

An audio noise spectrum together with an audio reference spectrum may be used to determine a compensation spectrum.

A compensation spectrum may be used to control an equalizer in order to adjust the balance between frequency components of an audio signal to be listened to by a listener.

A compensation spectrum may for example be represented by frequencies, phases, amplitudes and/or square amplitudes. A compensation spectrum may in particular be a power spectrum comprising amplitudes or squared amplitudes.

A compensation spectrum may comprise any number of data values (e.g. amplitudes, square amplitudes, or the like). For example a compensation spectrum may comprise only a few values which represent specific areas within a frequency spectrum, such as low frequencies (bass), mid frequencies and high frequencies. However, a compensation spectrum may also comprise a large number of data values where each frequency region is represented by many data values. In other words, a compensation spectrum can be chosen arbitrarily fine or coarse, depending on the specific needs and/or conceptions.

A compensation spectrum may for example be used to adjust the balance between frequency components of a music signal that is reproduced in an electronic device such as an audio player or a mobile phone.

Determining the audio noise spectrum may comprise calculating a noise sound pressure level spectrum of external noise based on a captured audio noise signal. In particular, determining an audio noise spectrum may comprise calculating a noise sound pressure level spectrum at the listener's ears. A transfer function that describes the damping of external noise when travelling through a headphone may for example be used in calculating a noise sound pressure level spectrum at the listener's ears.

Determining an audio reference spectrum may comprise calculating a reference sound pressure level spectrum based on a captured audio reference signal and based on a sensitivity function. A sensitivity function may for example describe the sensitivity of a headphone used by a listener for listening to audio content. A sensitivity function relates electrical power which is fed to a headphone to the respective sound pressure level obtained by the headphone based on the electrical power. The sensitivity of a headphone may for example be defined as the sound pressure level (dB lin.) at 1 mW nominal power at 1 kHz.

An audio reference signal may be obtained by measuring a voltage signal at an audio output amplifier of an electronic device. The voltage signal may thus correspond to a voltage signal applied to a headphone from an audio output amplifier of an audio player.

In alternative embodiments the audio reference signal is obtained by capturing an audio source signal produced by an audio renderer. In this case, the audio reference signal may, for example, be obtained by amplifying an audio source signal produced by an audio renderer according to the gain control of a listener, and then this audio source signal can be Fast Fourier Transformed (FFT) in order to obtain an audio reference spectrum.

Determining a compensation spectrum may comprise subtracting the audio reference spectrum from the audio noise spectrum.

A compensation spectrum may, for example, be obtained by subtracting a power spectrum of the audio noise from a power spectrum of the audio reference.

The compensation spectrum may be subtracted from a target frequency response, which will result in a boost or a cut of corresponding frequencies.

The compensation spectrum may be limited in order not to exceed a certain boost or cut of several frequencies, thus minimizing the energy used for the compensation ensuring that the playback capabilities of a headphone driver are not exceeded.

The method may further comprise integrating the compensation spectrum over a certain period of time. This may avoid abrupt changes in the frequency compensation which might disturb the listener's experience of audio content. The integration may, for example, be applied on a time scale of about some seconds, for example three seconds, five seconds or even more seconds. The integration may in particular result in an averaging of the compensation spectrum over a certain period of time.

The method may further comprise determining a compensated audio signal based on the compensation spectrum and based on an audio source signal. This may allow to dynamically adjust the frequency response so that a listener can always perceive all music frequencies well balanced and have no degradation especially in the bass frequency region.

Determining a compensated audio signal based on the compensation spectrum and based on an audio source signal may comprise balancing the audio source signal according to the compensation spectrum. For example, determining a compensated audio signal based on the compensation spectrum and based on an audio source signal may be implemented by an equalizer that balances an audio source signal based on compensation values obtained from the compensation spectrum.

Determining the compensation spectrum may further be based on a target spectrum. The target spectrum may represent user preferences, such as a setting which increases bass frequencies compared to mid and high frequencies.

The target spectrum may, however, be a user option. Should a user not actively provide user preferences, the target spectrum may be chosen to be flat, which means that no modification of the compensation spectrum is applied.

The method may further comprise limiting the compensation spectrum. This limiting may be done by a limiting block and it may be used to not exceed a certain boost or cut of several frequencies, thus minimizing the energy used for the compensation and ensuring that playback capabilities of a headphone driver are not exceeded.

The disclosed methods may preserve the full sonic perception of all frequencies of a music playback even in case of the existence of an external masking environmental noise. The methods may adjust dynamically to varying degrees of external noise such that all spectral components can be heard at any time.

The embodiments also disclose an electronic device comprising a noise spectrum determination unit arranged to determine an audio noise spectrum that represents external audio noise, a reference spectrum determination unit arranged to determine an audio reference spectrum that represents audio content to be perceived by a listener, and a compensation spectrum determination unit arranged to determine a frequency compensation spectrum based on the audio noise spectrum and based on the audio reference spectrum.

The electronic device may for example be an audio player or a mobile phone, a car radio or any other sound reproduction system.

The noise spectrum determination unit may comprise a microphone for capturing external audio noise.

The electronic device may further comprise an equalizer which is arranged for balancing an audio source signal based on the compensation spectrum.

Embodiments are now described by reference to the accompanying drawings.

Figure 1:
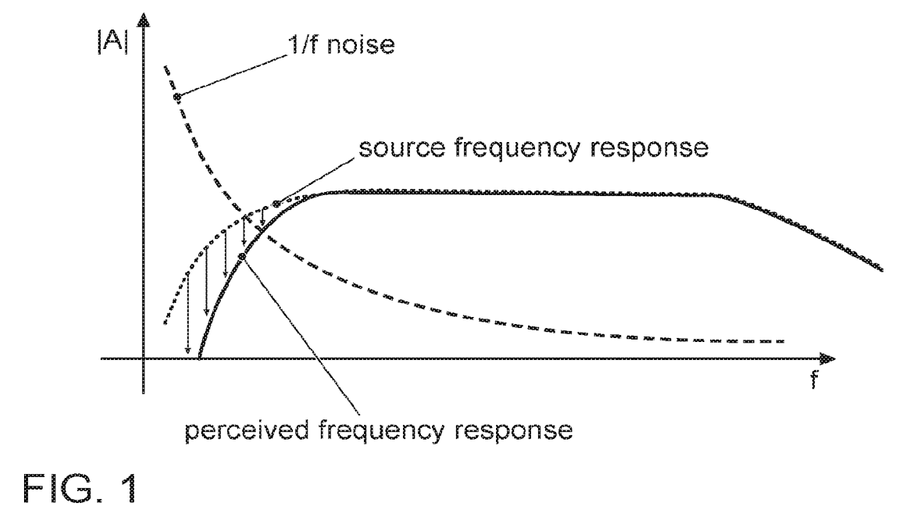
FIG. 1 shows a diagram which schematically describes the interrelation between a source frequency response, 1/f noise, and a respective perceived frequency response.

FIG. 1 shows a diagram which schematically describes the interrelation between a source frequency response, 1/f noise, and the perceived frequency response. The diagram shows on the abscissa frequency values and on the ordinate respective amplitude levels. The dotted line represents a source frequency response of audio content to be perceived by a listener. The dashed line indicates the frequency response of an external noise signal. The noise signal has a 1/f characteristic, which means that the noise is large for low frequencies and the noise gets smaller with increasing frequencies. As can be seen from the diagram in FIG. 1, the perceived frequency response is damped in regions where the 1/f noise is large. The solid line describes the frequency response as perceived by a listener.

If a 1/f frequency spectral distribution of the surrounding noise is considered, as it is done in FIG. 1, especially the lower frequencies will be perceived as less intense. In case of other noise distributions, other frequency ranges might be affected as well.

Figure 2:
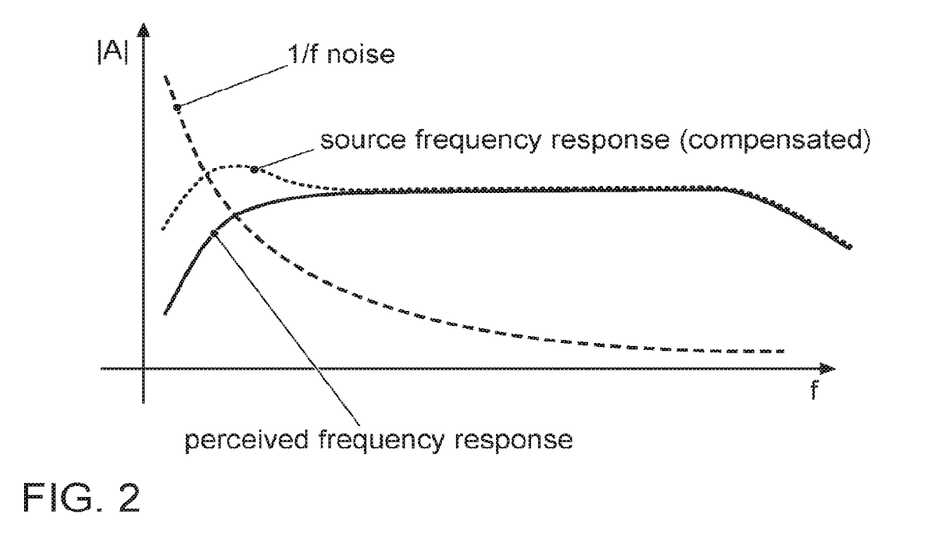
FIG. 2 shows a diagram which schematically describes the interrelation between 1/f noise, a compensated frequency response, and a perceived frequency response.

FIG. 2 shows a diagram that schematically describes the interrelation between a compensated frequency response, 1/f noise, and a perceived frequency response. Again, the dashed line indicates a frequency response of an external noise signal. The dotted line represents a source frequency response of audio content that has been compensated by means of a compensation spectrum. The compensated source frequency response corresponds substantially to the source frequency response in FIG. 1. However, by means of equalization the balancing of the frequency components of the source frequency response has been changed in order to compensate for any damping by 1/f noise. That is, in the low frequency regions the balancing of the source frequency response increases the amplitude of the source frequency response so that a respected compensated frequency response is larger than the original source frequency response. The compensated frequency response, if affected by the 1/f noise signal is damped, but the compensation spectrum is chosen in such a way that the damped compensated frequency response results in a perceived frequency response (solid line in FIG. 2) which to a large extent resembles that of the original source frequency response (see FIG. 1).

Here, in particular, the compensated source frequency response has increased frequencies in the bass range so that the damping by 1/f noise does not lead to a degraded listening experience.

Figure 3:
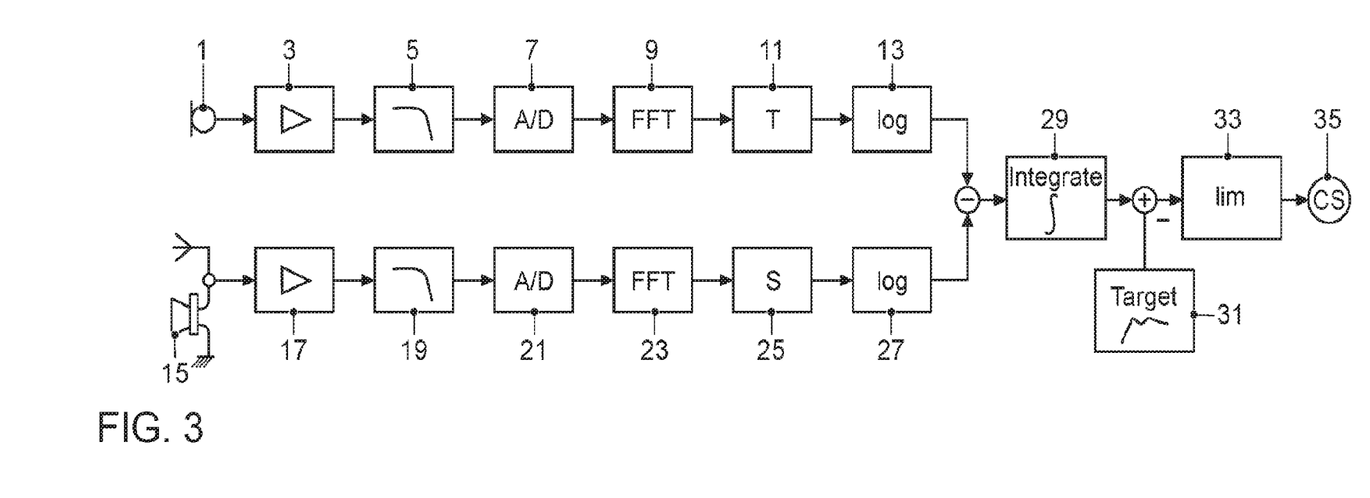
FIG. 3 schematically shows an embodiment of a device for determining a compensation spectrum.

FIG. 3 schematically shows an embodiment of a device for determining a compensation spectrum based on an audio noise spectrum and based on an audio reference spectrum.

A microphone 1 captures external audio noise. The audio noise signal is amplified by amplifier 3. The amplified noise signal is fed through a low-pass filter 5 that passes signals with a frequency lower than a certain threshold frequency and attenuates signals with frequencies higher than the threshold frequency. The low-pass filtered signal is fed to an analogue-digital (A/D) converter 7 which transforms the captured audio signal into a digital signal. The digital signal is fed to a Fast Fourier Transform (FFT) 9 in order to generate a frequency spectrum. Then, a transfer function 11 is applied to the resulting frequency spectrum. The transfer function 11 simulates the attenuation of the external noise when propagating to the listener's ears. The resulting audio noise spectrum represents the sound pressure level as felt at the listener's ears. The resulting audio noise spectrum is passed through a logarithmic unit 13 which logarithmizes the audio noise spectrum.

The result of this computation is an audio noise spectrum, here a Sound Pressure Level (SPL) spectrum, that represents external audio noise as received at a listener's ears. The thus obtained audio noise spectrum may be further processed together with an audio reference spectrum, as described below in more detail.

An audio reference spectrum is obtained as follows.

A voltage measurement is performed at the output amplifier of an electronic device. The measured voltage signal represents the signal which the output amplifier feeds to loud speaker 15 (here a headphone). The measured voltage signal is amplified in an amplifier 17, passed through a low-pass filter 19, and transformed into digital data by an analogue-digital (A/D) converter 21. The digital data is fed to a Fast Fourier Transform 23, and the resulting frequency spectrum is processed in a sensitivity function 25 which converts the electrical voltage measurement into a sound pressure level. The sensitivity function 25 allows to estimate the Sound Pressure Level (SPL) which acts at the listener's ears when the electrical signal measured at the output amplifier is fed to headphone 15. The resulting sound pressure level spectrum is logarithmized at logarithmization unit 27 in order to obtain an audio reference spectrum.

The audio reference spectrum thus obtained can be further processed together with the audio noise spectrum obtained at logarithmization unit 13.

In this embodiment, the audio reference spectrum obtained at the logarithmization unit 27 is subtracted from the audio noise spectrum obtained at the logarithmization unit 13.

In particular, during subtraction, Sound Pressure Level (SPL) values of the audio noise spectrum and the audio reference spectrum are subtracted from each other.

Still further, as explained in more detail with reference to FIG. 5 below, subtracting the audio reference spectrum from the audio noise spectrum may comprise restricting the compensation spectrum to a frequency range which is defined by a maximum frequency.

The resulting difference spectrum can be used as a compensation spectrum.

After subtraction, the difference spectrum is fed to an integrator 29 which integrates the difference spectrum over a certain period of time.

The resulting difference spectrum is then modified based on a target spectrum 31. This target spectrum 31 represents user preferences. The modification may, for example, consist in adding or subtracting the target spectrum from the difference spectrum.

The resulting modified difference spectrum is then passed to a limiter 33, which limits the difference spectrum so as not to exceed a certain boost or cut of several frequencies.

The resulting limited difference signal, which is based on the audio noise spectrum obtained from microphone 1 and which is based on the audio reference spectrum obtained from the voltage measurement at the output amplifier which feeds loudspeaker 15, may then be used as a compensation spectrum in further processing.

Figure 4:
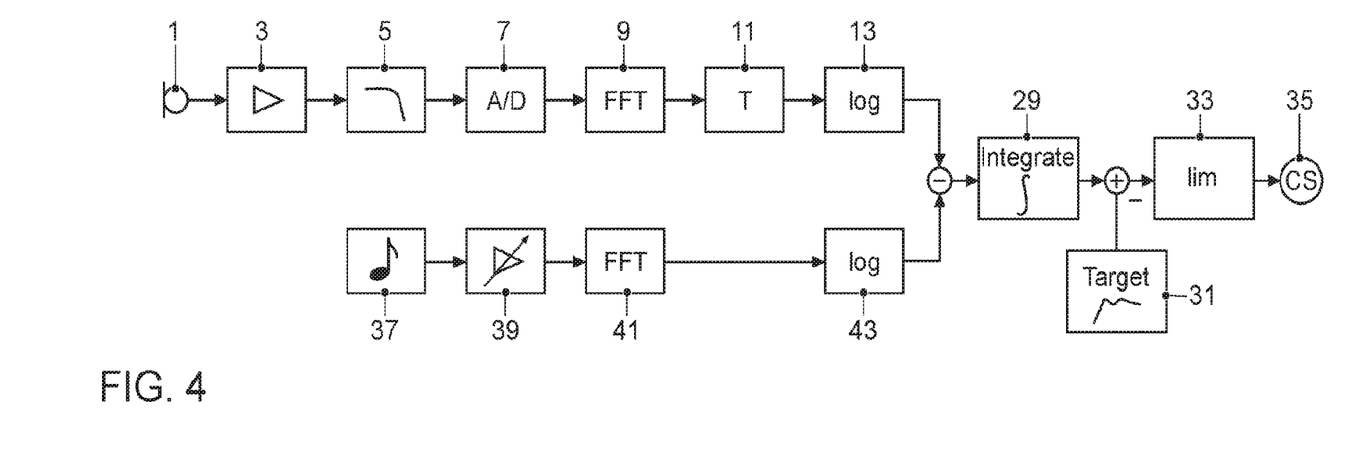
FIG. 4 schematically shows a further embodiment of a device for determining a compensation spectrum.

FIG. 4 shows an alternative embodiment of a method for determining a compensation spectrum based on an audio noise spectrum and based on an audio reference spectrum. The determination of an audio noise spectrum is similar to that of the previous embodiment described with regard to FIG. 3. A microphone 1 captures external audio noise. The captured audio noise signal is amplified in an amplifier 3 and passed through a low-pass filter 5, then digitalized in an analogue-digital (A/D) converter 7, passed through a Fast Fourier Transform 9, processed by a transfer function 11, and logarithmized in logarithmization unit 13 in order to obtain an audio noise spectrum.

An audio reference spectrum is obtained by rendering audio content with an audio renderer 37, passing the resulting audio signal through a user controlled gain controller 39, passing the resulting signal through a Fast Fourier Transform 41, and logarithmizing the resulting signal with logarithmization unit 43.

The resulting audio reference spectrum is further processed together with the audio noise spectrum as follows.

The audio reference spectrum obtained from microphone 1 is subtracted from the audio noise signal obtained from audio renderer 37. The resulting difference signal is integrated in integrator 29, and then modified by a target spectrum 31. The resulting difference spectrum is finally passed through a limiter 33 in order to obtain the compensation spectrum 35.

Figure 5:
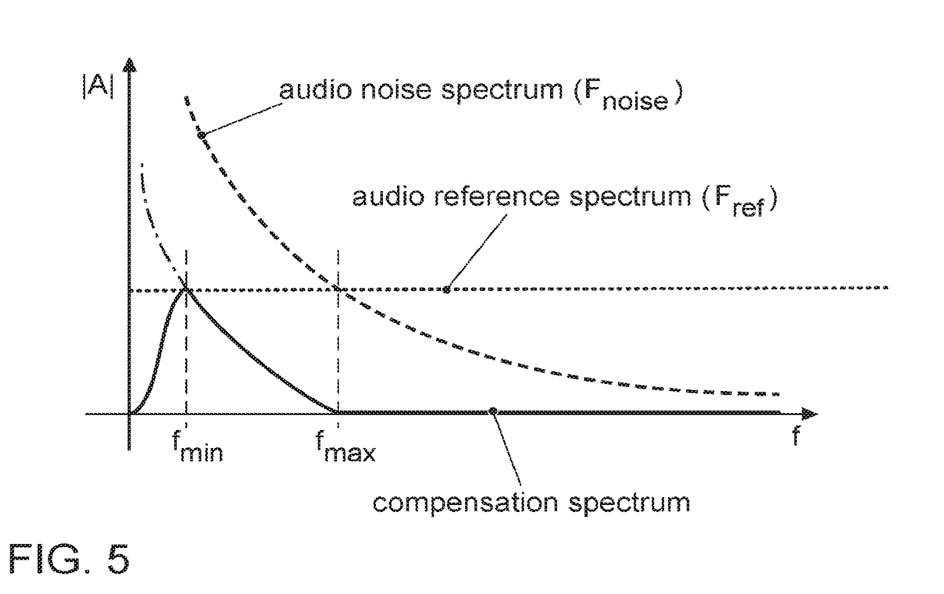
FIG. 5 schematically describes an example of subtracting the audio reference spectrum from the audio noise spectrum.

FIG. 5 schematically describes an example of subtracting the audio reference spectrum from the audio noise spectrum. In this embodiment, subtracting the audio reference spectrum from the audio noise spectrum comprises restricting the compensation spectrum to a frequency range which is defined by a maximum frequency.

First amplitudes of an audio reference spectrum $F_{ref}$ (dotted line) are subtracted from amplitudes of an audio noise spectrum $F_{noise}$ (dashed line) to obtain differences $F_{noise}-F_{ref}$. Then a maximum function $F_{diff}=\max(F_{noise}-F_{ref}, 0)$ is applied to the differences $F_{noise}-F_{ref}$ so that negative values of the differences are set to zero. As a result, the compensation is restricted to a frequency range which is limited by a maximum frequency $f_{max}$, where $f_{max}$ corresponds to the frequency value where the audio noise spectrum and the audio reference spectrum have equal values.

Still further, in this embodiment, below a minimum frequency $f_{min}$ the compensation is continuously decreased to zero in order to avoid overstressing an audio system. This limitation can for example take place in limiter 33 of FIG. 3, i.e. after subtraction of the audio reference spectrum from the audio noise spectrum and after integrating the difference spectrum. Still alternatively, the limitation can also take place directly during the subtraction or immediately after the subtraction.

The final compensation spectrum obtained in this way is shown in FIG. 5 as a solid line.

It should be noted that in order to make the subtraction more comprehensible, in the schematic diagram of FIG. 5 the audio reference spectrum is simplified as a flat spectrum. In reality, the shape of the audio reference spectrum might of course be more complex. For example, the shape of the audio reference spectrum might resemble the shape of the source frequency response shown in FIG. 1.

In the description above an embodiment has been described wherein a compensation spectrum is obtained by subtracting an audio reference spectrum from an audio noise spectrum. Other ways of obtaining the compensation spectrum based on an audio reference spectrum and based on an audio noise spectrum are also conceivable. For example, in an alternative embodiment a set of possible reference spectra and noise spectra is prestored in a lookup table together with respective predefined compensation spectra. In this case, a compensation spectrum can be obtained by searching in the lookup table for an entry which is close to a measured audio reference spectrum and measured audio noise spectrum, and the predefined compensation spectrum of the found entry can then be chosen as compensation spectrum to be applied.

Figure 6:
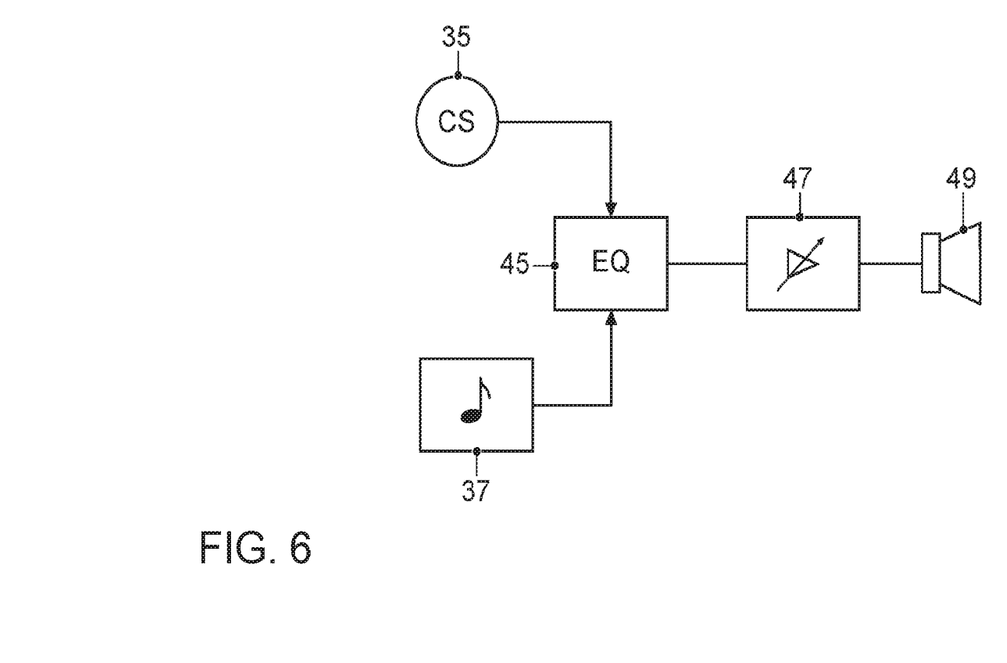
FIG. 6 schematically shows an embodiment of a device for producing a compensated audio signal based on an source signal file and a compensation spectrum.

FIG. 6 schematically describes a device for determining a compensated audio signal based on a compensation spectrum and based on an audio source signal.

An audio source signal 37 (e.g. the output of a media player) is passed to an equalizer 45. The equalizer 45 is arranged to adjust the balance between frequency components of the audio source signal 37 based on compensation spectrum 35. The equalizer outputs a compensated audio signal. The compensated audio signal is passed through a user controlled gain controller 47 and is then output to a loud speaker 49, here a headphone used by the listener of the audio source signal. This loud speaker may for example be the same loud speaker as loud speaker 15 in FIG. 3 at which the audio reference signal is obtained. That is, the compensated audio signal may itself act as audio reference signal and the compensation will automatically stabilize on its own.

As described above, the equalizer 45 is arranged to adjust the balance between frequency components of the audio source signal 37 based on compensation spectrum 35. For example, if the compensation spectrum has large values in the low frequency regime, equalizer 45 enhances the low frequency components of the audio source signal 37 accordingly. If, however, the compensation spectrum has small values in a specific frequency regime, equalizer 45 does not modify the respective frequency components of the audio source signal 37. In some embodiments, equalizer settings are directly obtained from a compensation spectrum. In other embodiments a lookup table is used which associates predefined compensation spectra with respective equalizer settings.

Figure 7:
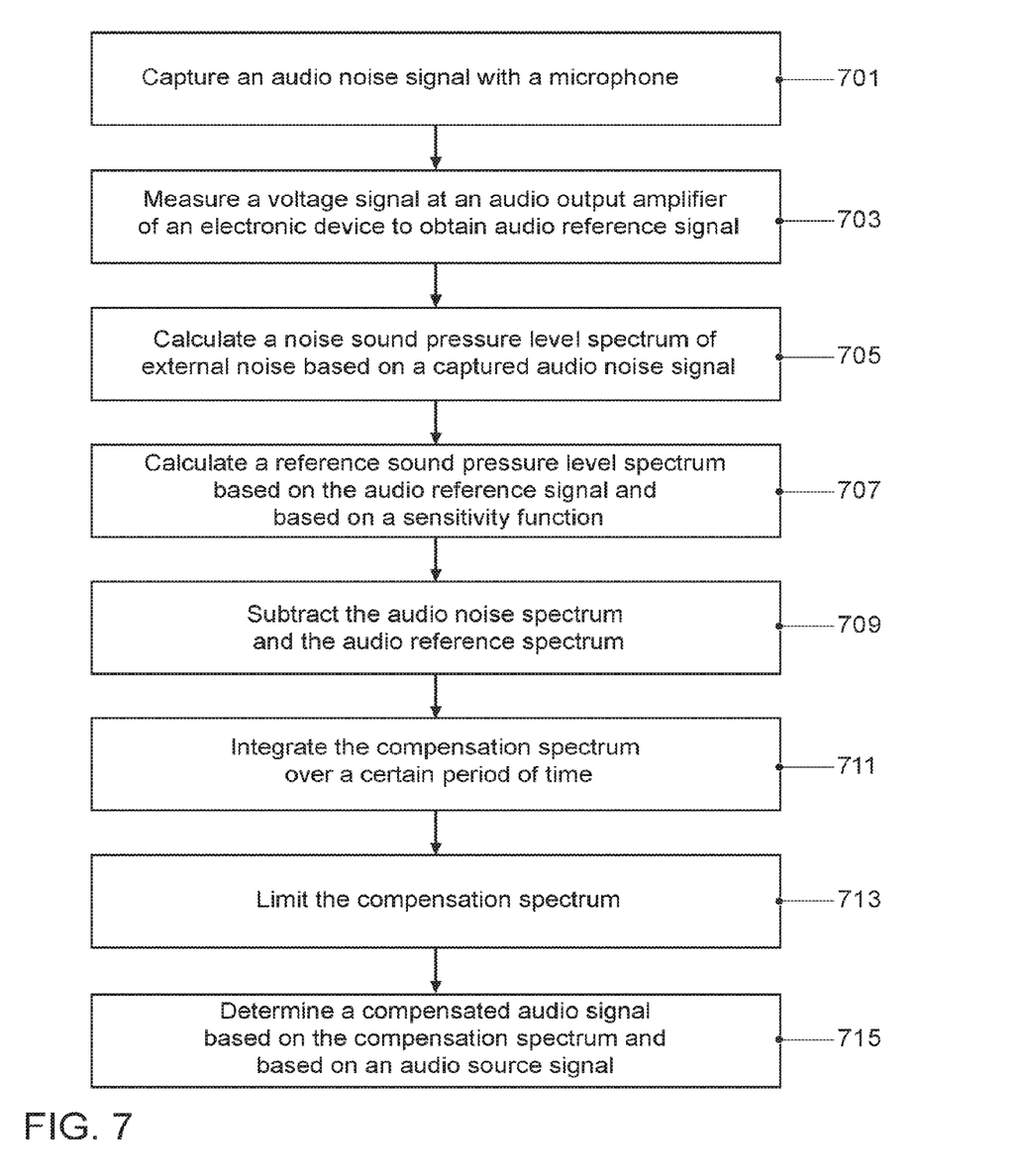
FIG. 7 describes an embodiment of a method for generating a compensated audio signal.

FIG. 7 shows an embodiment of a method for determining a compensated audio signal based on a compensation spectrum and based on an audio source signal. At 701 an audio noise signal is captured with a microphone. At 703 a voltage signal is measured at an audio output amplifier of an electronic device to obtain an audio reference signal. At 705 a noise sound pressure level spectrum of the external noise is calculated based on the captured audio noise signal. At 707 a reference sound pressure level spectrum is calculated based on the audio reference signal and based on a sensitivity function. At 709 the audio noise spectrum and the audio reference spectrum are subtracted to obtain a compensation spectrum. At 711 the compensation spectrum is integrated over a certain period of time. At 713 the compensation spectrum is limited. Finally, at 715 a compensated audio signal is determined based on the compensation spectrum and based on an audio source signal.

Figure 8:
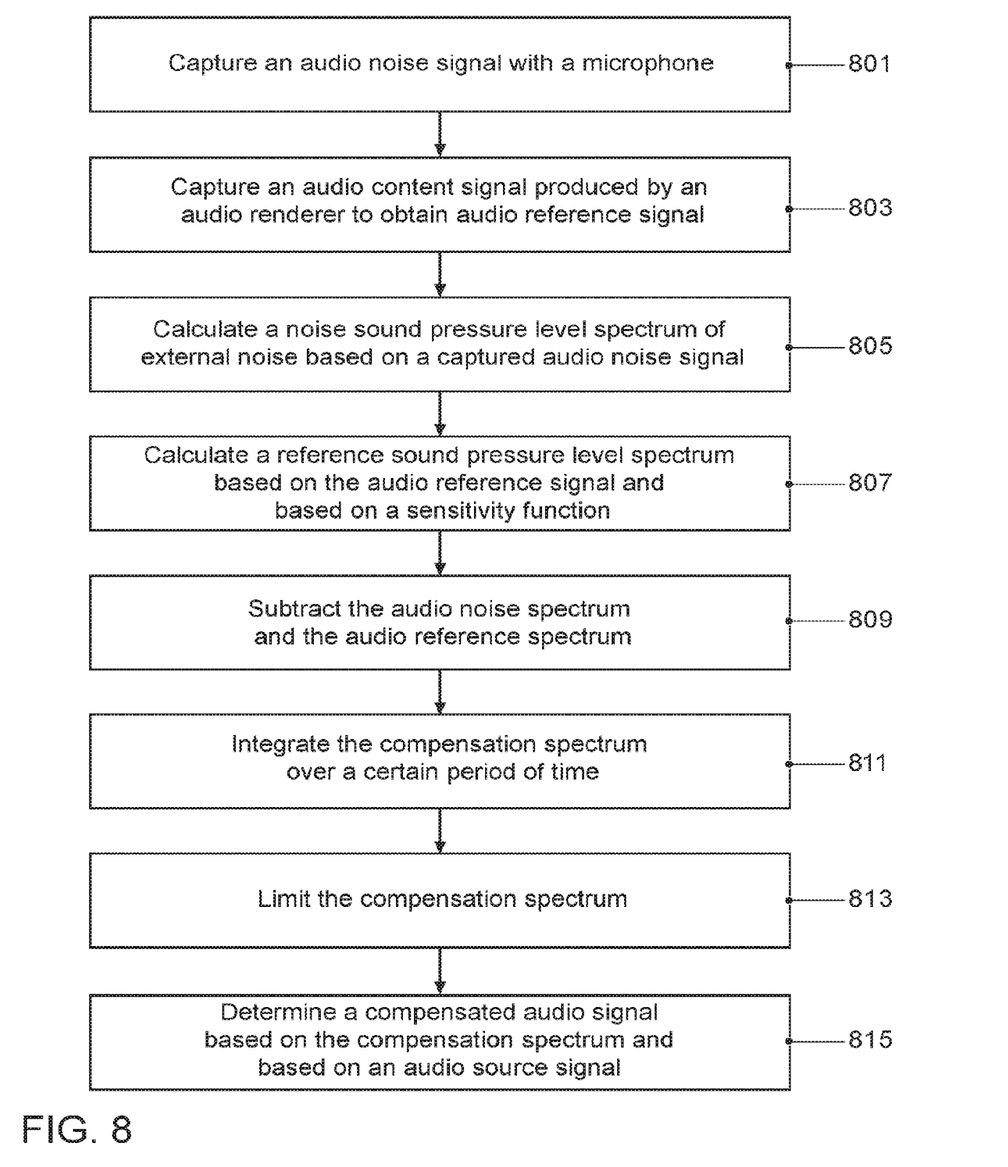
FIG. 8 describes a further embodiment of a method for determining a compensated audio signal.

FIG. 8 shows a further embodiment of a method for determining a compensated audio signal based on a compensation spectrum and based on an audio source signal. At 801 an audio noise signal is captured with a microphone. At 803 an audio source signal produced by an audio renderer is captured to obtain an audio reference signal. At 805 a noise sound pressure level spectrum of external noise is calculated based on a captured audio noise signal. At 807 a reference sound pressure level spectrum is calculated based on the audio reference signal and based on a sensitivity function. At 809 the audio noise spectrum and the audio reference spectrum are subtracted. At 811 the compensation spectrum is integrated over a certain period of time. At 813 the compensation spectrum is limited. Finally, at 815 a compensated audio signal is determined based on the compensation spectrum and based on an audio source signal.

The methods as described herein are also implemented in some embodiments as a computer program causing a computer and/or a processor to perform the method, when being carried out on the computer and/or processor. In some embodiments, also a non-transitory computer-readable recording medium is provided that stores therein a computer program product, which, when executed by a processor, such as the processor described above, causes the methods described herein to be performed.

It should be recognized that the embodiments describe methods with an exemplary ordering of method steps. The specific ordering of method steps is however given for illustrative purposes only and should not be construed as binding. For example the ordering of 701 and 703 or the ordering of 705, 707 in the embodiment of FIG. 7 may be exchanged. Also, the ordering of 709 and 711 in the embodiment of FIG. 7 may be exchanged. Further, also the ordering of 711 and 713 in the embodiment of FIG. 7 may be exchanged. The same applies for the respective steps in the embodiment of FIG. 8. Other changes of the ordering of method steps may be apparent to the skilled person.

It should also be noted that the division of the device of FIG. 3 or FIG. 4 into units is only made for illustration purposes and that the present disclosure is not limited to any specific division of functions in specific units. For instance, the Fast Fourier Transform (FFT) 9 and the transfer function 11 could be implemented by a respective programmed processor, field programmable gate array (FPGA) and the like.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using a software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) A method comprising:
  determining an audio noise spectrum that represents external audio noise,
  determining an audio reference spectrum that represents audio content to be perceived by a listener, and
  determining a compensation spectrum based on the audio noise spectrum and based on the audio reference spectrum.

(2) The method of (1), wherein determining the audio noise spectrum comprises calculating a noise sound pressure level spectrum of external noise based on a captured audio noise signal.

(3) The method of (2), wherein the audio noise signal is captured with a microphone.

(4) The method of anyone of (1) to (3), wherein determining an audio reference spectrum comprises calculating a reference sound pressure level spectrum based on a captured audio reference signal and based on a sensitivity function.

(5) The method of anyone of (1) to (4), wherein the audio reference signal is obtained by measuring a voltage signal at an audio output amplifier of an electronic device.

(6) The method of anyone of (1) to (4), wherein the audio reference signal is obtained by capturing an audio source signal produced by an audio renderer.

(7) The method of anyone of (1) to (6), wherein determining the compensation spectrum comprises subtracting the audio noise spectrum and the audio reference spectrum.

(8) The method of anyone of (1) to (7), further comprising integrating the compensation spectrum over a certain period of time.

(9) The method of anyone of (1) to (8), further comprising determining a compensated audio signal based on the compensation spectrum and based on an audio source signal.

(10) The method of (9) wherein determining a compensated audio signal based on the compensation spectrum and based on an audio source signal comprises balancing the audio source signal according to the compensation spectrum.

(11) The method of anyone of (1) to (10), wherein determining the compensation spectrum is further based on a target spectrum.

(12) The method of anyone of (1) to (11), further comprising limiting the compensation spectrum.

(13) An electronic device comprising
  a noise spectrum determination unit arranged to determine an audio noise spectrum that represents external audio noise,
  a reference spectrum determination unit arranged to determine an audio reference spectrum that represents audio content to be perceived by a listener, and
  a compensation spectrum determination unit arranged to determine a frequency compensation spectrum based on the audio noise spectrum and based on the audio reference spectrum.

(14) The electronic device of (13), wherein the noise spectrum determination unit comprises a microphone for capturing external audio noise.

(15) The electronic device of (13) or (14), wherein the reference spectrum determination unit is arranged to measure a voltage signal at an audio output amplifier of the electronic device.

(16) The electronic device of anyone of (13) to (15), further comprising an equalizer which is arranged for balancing an audio source signal based on the compensation spectrum.

(17) A computer program comprising instructions, the instructions when executed on a processor of an electronic device causing the electronic device to:
  determine an audio noise spectrum that represents external audio noise, determine an audio reference spectrum that represents audio content to be perceived by a listener, and determine a compensation spectrum based on the audio noise spectrum and based on the audio reference spectrum.

(18) A computer program comprising instructions, the instructions when executed on a processor of an electronic device causing the electronic device to perform the method of anyone of (1) to (11).

The invention claimed is:

1. An electronic device comprising:
    circuitry configured to
        obtain an audio reference signal based on a voltage signal measured at an audio output amplifier of the electronic device;
        determine an audio noise spectrum that represents external audio noise by calculating a reference sound pressure level spectrum based on the audio reference signal;
        determine an audio reference spectrum that represents audio content to be perceived by a listener; and
        determine a compensation spectrum based on the audio noise spectrum and the audio reference spectrum.

2. The electronic device claim 1, wherein the circuitry is configured to determine the audio reference spectrum by calculating the reference sound pressure level spectrum based on the audio reference signal and a sensitivity function.

3. The electronic device of claim 1, wherein the circuitry is configured to obtain the audio reference signal by capturing an audio source signal produced by an audio renderer.

4. The electronic device of claim 1, wherein the circuitry is configured to determine the compensation spectrum by subtracting the audio reference spectrum from the audio noise spectrum.

5. The electronic device of claim 1, wherein the circuitry is configured to determine a compensated audio signal based on the compensation spectrum and an audio source signal.

6. The electronic device of claim 5, wherein the circuitry is configured to determine the compensated audio signal by balancing the audio source signal according to the compensation spectrum.

7. The electronic device of claim 1, wherein the circuitry is configured to determine the compensation spectrum based on a target spectrum.

8. The electronic device of claim 1, wherein the circuitry is configured to limit the compensation spectrum.

9. An electronic device comprising:
    circuitry configured to
        measure a voltage signal an audio output amplifier of the electronic device;
        determine an audio noise spectrum that represents external audio noise by calculating a reference sound pressure level spectrum based on the measured voltage signal;
        determine an audio reference spectrum that represents audio content to be perceived by a listener; and
        determine a frequency compensation spectrum based on the audio noise spectrum and the audio reference spectrum.

10. The electronic device of claim 9, further comprising: a microphone for capturing external audio noise.

11. The electronic device of claim 9, wherein the circuitry is configured to balance an audio source signal based on the compensation spectrum.

12. A method comprising:
    obtaining an audio reference signal based on a voltage signal measured at an audio output amplifier of an electronic device;
    determining an audio noise spectrum that represents external audio noise by calculating a reference sound pressure level spectrum based on the audio reference signal;
    determining an audio reference spectrum that represents audio content to be perceived by a listener; and
    determining a compensation spectrum based on the audio noise spectrum and the audio reference spectrum.

13. The electronic device of claim 9, wherein the circuitry is configured to determine the frequency compensation spectrum based on a target spectrum.

14. The electronic device of claim 9, wherein the circuitry is configured to limit the frequency compensation spectrum.

* * * * *